(12) United States Patent
Kawakami

(10) Patent No.: US 12,058,875 B2
(45) Date of Patent: Aug. 6, 2024

(54) TRANSISTOR PRODUCTION METHOD

(71) Applicant: NIKON CORPORATION, Tokyo (JP)

(72) Inventor: Yusuke Kawakami, Yohohama (JP)

(73) Assignee: NIKON CORPORATION, Tokyo (JP)

( * ) Notice: Subject to any disclaimer, the term of this patent is extended or adjusted under 35 U.S.C. 154(b) by 207 days.

(21) Appl. No.: 17/182,948

(22) Filed: Feb. 23, 2021

(65) Prior Publication Data
US 2021/0184143 A1 Jun. 17, 2021

Related U.S. Application Data

(63) Continuation of application No. PCT/JP2019/031701, filed on Aug. 9, 2019.

(30) Foreign Application Priority Data

Aug. 30, 2018 (JP) .................. 2018-161269

(51) Int. Cl.
*H01L 51/00* (2006.01)
*H10K 10/46* (2023.01)
*H10K 71/12* (2023.01)

(52) U.S. Cl.
CPC ........... *H10K 10/466* (2023.02); *H10K 71/12* (2023.02)

(58) Field of Classification Search
CPC ............ H01L 51/0545; H01L 51/0003; H10K 10/466; H10K 71/12
See application file for complete search history.

(56) References Cited

U.S. PATENT DOCUMENTS

| | | | |
|---|---|---|---|
| 2008/0032440 A1 | 2/2008 | Huang et al. | |
| 2017/0054076 A1* | 2/2017 | Nagata | C08F 220/283 |
| 2017/0285471 A1* | 10/2017 | Kawakami | G03F 7/2002 |
| 2020/0303650 A1* | 9/2020 | Kawakami | G03F 7/0755 |

FOREIGN PATENT DOCUMENTS

| | | |
|---|---|---|
| JP | 2008-50321 A | 3/2008 |
| JP | 2008-60116 A | 3/2008 |
| JP | 2008-130882 A | 6/2008 |

(Continued)

OTHER PUBLICATIONS

International Search Report dated Nov. 5, 2019, in corresponding International Patent Application No. PCT/JP2019/031701.

(Continued)

*Primary Examiner* — Victor A Mandala
*Assistant Examiner* — Colleen E Snow

(57) ABSTRACT

Provided is a transistor production method including: forming a gate electrode on an object by using a conductive material; forming an insulating film on the gate electrode; forming a photoresponsive film on the insulating film by using a material containing a compound having a photoresponsive nitrobenzyl group; selectively exposing the photoresponsive film to dissociate the photoresponsive group in an exposed area, forming a pattern including a hydrophilic exposed area and a water-repellent unexposed area, disposing a conductive material in the exposed area to form a source electrode and a drain electrode, and forming a modified layer by subjecting the unexposed area to a plasma irradiation to remove a water-repellent film and further subjecting to a surface treatment; and forming a semiconductor layer on the modified layer.

16 Claims, 4 Drawing Sheets

(56) References Cited

FOREIGN PATENT DOCUMENTS

| | | |
|---|---|---|
| JP | 2011-54774 A | 3/2011 |
| JP | 2011-216647 A | 10/2011 |
| JP | 2016-157111 A | 9/2016 |
| JP | 2017-79319 A | 4/2017 |
| TW | 2008/07778 A | 2/2008 |
| WO | WO 2009/044659 A | 4/2009 |

OTHER PUBLICATIONS

Written Opinion of the International Searching Authority dated Nov. 5, 2019, in corresponding International Patent Application No. PCT/JP2019/031701.
Japanese Office Action dated Aug. 8, 2023 for Japanese Application No. 2022-111711.
Japanese Office Action dated Jan. 9, 2024 for Japanese Application No. 2022-111711.
Taiwanese Office Action dated Mar. 26, 2024 for Taiwanese Application No. 112125504.

* cited by examiner (a)

(b)

(c)

TRANSISTOR PRODUCTION METHOD

TECHNICAL FIELD

The present invention relates to a transistor production method.

This application is a continuation of International Application No. PCT/JP2019/031701, filed Aug. 9, 2019, which claims the foreign priority benefit to Japanese Patent Application No. 2018-161269, filed on Aug. 30, 2018, the content of which are incorporated herein by reference.

BACKGROUND ART

In recent years, in producing of micro-devices such as devices for semiconductor devices, integrated circuits, organic EL displays, and the like, a method in which patterns each having different surface characteristic are formed on a substrate and the micro-device such as a thin film transistor is manufactured using the difference between the surface characteristics has been proposed. As a material for forming patterns having different surface characteristics, for example, a photodegradable coupling agent disclosed in Patent Document 1 is known. From the viewpoint of improving the performance of a transistor, a transistor having improved electrical characteristics is required.

CITATION LIST

Patent Document

[Patent Document 1]
Japanese Unexamined Patent Application, First Publication No. 2008-50321

SUMMARY OF INVENTION

According to an aspect of the present invention, a transistor production method includes: forming a gate electrode on an object by using a conductive material; forming an insulating film on the gate electrode; forming a photoresponsive film on the insulating film by using a material containing a compound having a photoresponsive nitrobenzyl group; selectively exposing the photoresponsive film to dissociate the photoresponsive group in an exposed area, forming a pattern including a hydrophilic exposed area and a water-repellent unexposed area, disposing a conductive material in the exposed area to form a source electrode and a drain electrode, and forming a modified layer by subjecting the unexposed area to a plasma irradiation to remove a water-repellent film and further subjecting to a surface treatment; and forming a semiconductor layer on the modified layer.

DESCRIPTION OF EMBODIMENTS

<Transistor Production Method>

Figure 1:
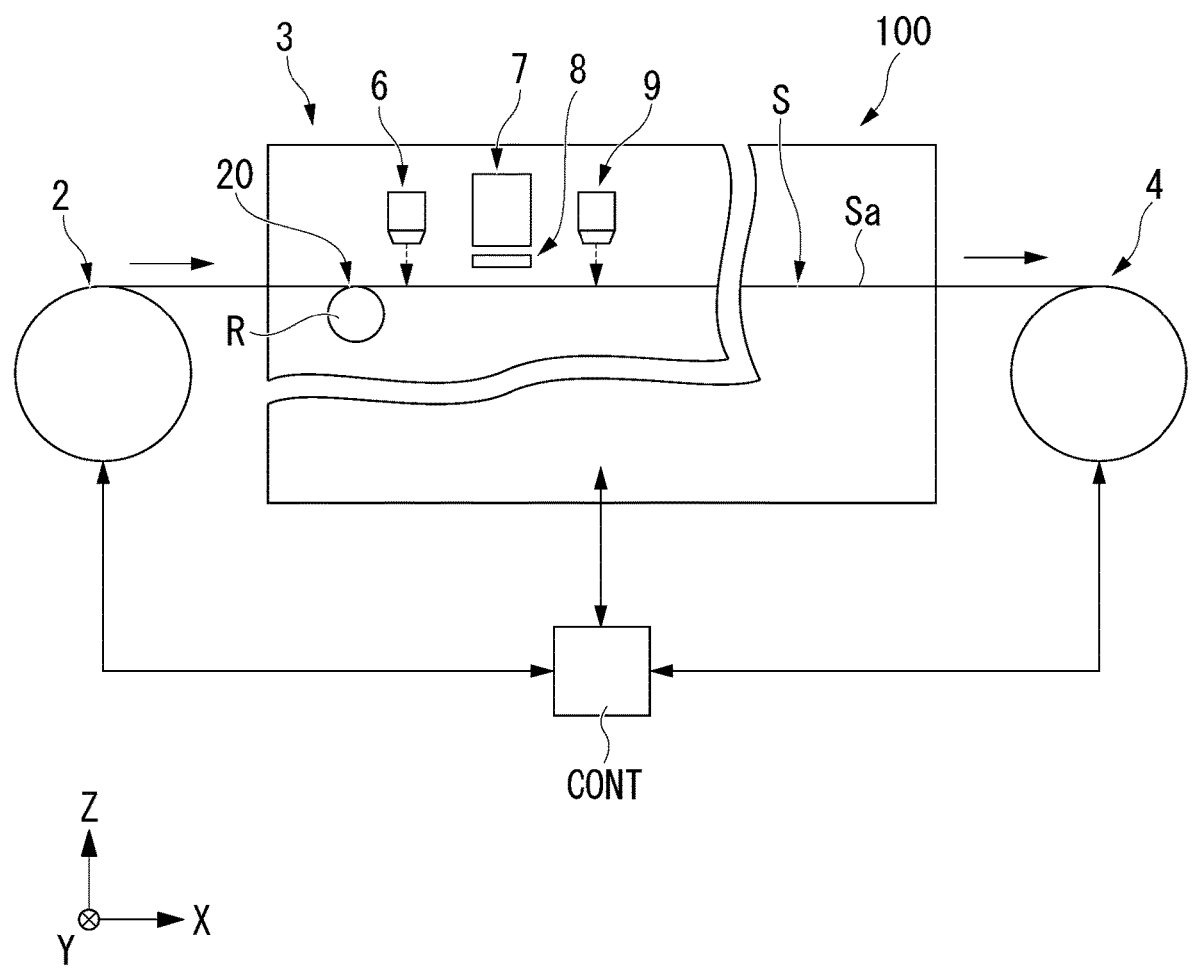
FIG. 1 is a schematic diagram showing an overall configuration of a substrate processing apparatus suitable for a transistor production method according to the present embodiment.

The present embodiment represents a transistor production method.

In the present embodiment, first, a gate electrode is formed on an object by using a conductive material, and an insulating film is formed on the gate electrode.

Next, a photoresponsive film is formed on the insulating film by using a material containing a compound having a photoresponsive nitrobenzyl group.

Next, the photoresponsive film is selectively exposed to dissociate the photoresponsive group in an exposed area to form a pattern including a hydrophilic exposed area and a water-repellent unexposed area.

Next, a conductive material is disposed on the exposed area to form a source electrode and a drain electrode.

Further, the unexposed area is subjected to a plasma irradiation to remove a water-repellent film and further subjected to a surface treatment to form a modified layer, and a semiconductor layer is formed on the modified layer.

When hydrophilic groups such as a carboxyl group, an amino group, and a hydroxyl group are present in contact with a channel region of a transistor, a polar group of these groups attracts carriers flowing through the channel region, a phenomenon called a "carrier trap" that hinders a flow of carriers is likely to occur. When the carrier trap occurs, a behavior of the transistor is not stable, for example, a problem such as hysteresis in element characteristics is likely to occur.

However, since wettability of a substrate surface can be suitably modified, a material containing a compound having a photoresponsive nitrobenzyl group is used. In a case where the compound is used, a nitrobenzyl group is present in the unexposed area. On the other hand, a hydrophilic group such as an amino group is present in a portion where a photodegradable group is decomposed by exposure.

Among the hydrophilic groups, an amino group is a functional group having a high surface free energy. Due to high hydrophilicity, adsorption of water or impurities may occur, which may cause a defect or deterioration of a device. Also, in a case where a surface free energy of a material to be laminated on an upper layer is significantly different, a desired adhesion, crystallinity or orientation may not be obtained.

An object of the present embodiment is to provide a method for producing a transistor having good characteristics even in a case where a material containing a compound having a photoresponsive nitrobenzyl group is used.

The transistor production method according to the present embodiment preferably includes a first pattern forming step of preparing a gate electrode, an insulating film forming step, a second pattern forming step of preparing a source electrode and a drain electrode, and a modified layer forming step, in this order.

Hereinafter, each step of the present embodiment will be described.

<<First Pattern Forming Step>>

First, steps to form a pattern formed of a hydrophilic exposed area on an object will be described.

The first pattern forming step is a step of forming a pattern on an object and disposing a conductive material on the pattern to prepare a gate electrode.

The first pattern forming step preferably includes a step of forming a photoresponsive film on the object, an exposure step, and a conductive material disposition step, in this order.

Step of Forming Photoresponsive Film on Object

Figure 2:
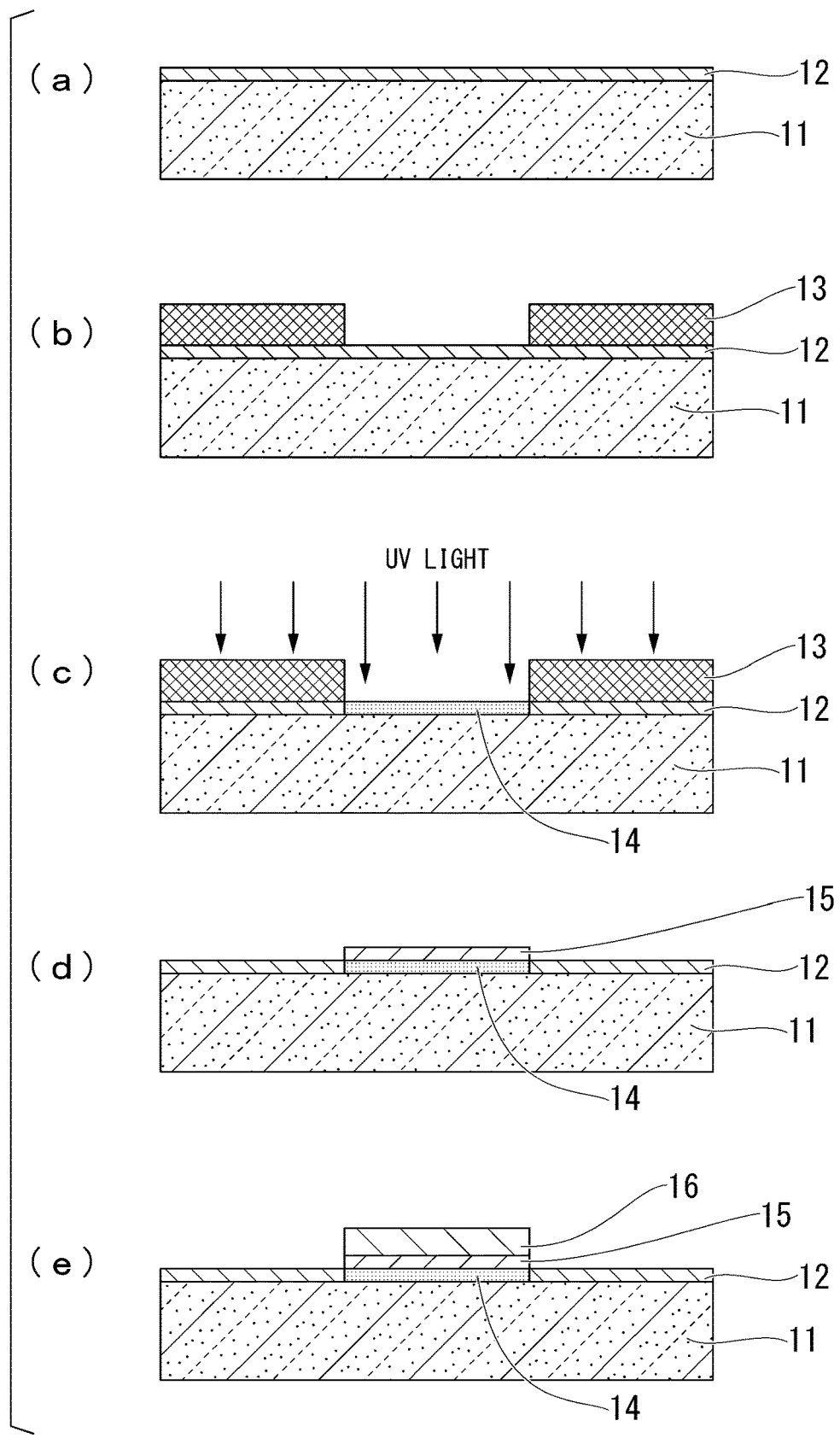
FIG. 2 is a diagram showing an example of a schematic step of the transistor production method.

First, as shown in FIG. 2(a), a photoresponsive film 12 containing a compound having a photoresponsive nitrobenzyl group is formed on a surface of a substrate 11.

The photoresponsive film 12 is preferably formed by an application on the object. The compound having a photoresponsive nitrobenzyl group contained in the photoresponsive film will be described later.

As an application method, any of general film forming techniques such as a physical vapor deposition (PVD) method, a chemical vapor deposition (CVD) method, and a liquid phase growth method may be used. Among these, the liquid phase growth method is particularly preferable. Examples of the liquid phase growth method include an application method (spin coating, dip coating, die coating, spray coating, roll coating, and brush coating), and a printing method (flexographic printing and screen printing).

In addition, a SAM film or an LB film may be used.

In the present step, processing of drying a solvent by, for example, heat or reduced pressure may be added.

Exposure Step

After forming the photoresponsive film on the object, the photoresponsive film is selectively exposed by being irradiated with light having a predetermined pattern. According to the exposure step, in the compound of the exposed area, a group having water repellency (protective group) is eliminated to generate a group having hydrophilicity, and the hydrophilic region is formed in the exposed area. In the unexposed area, this elimination does not occur and the water-repellent region remains as it is.

Since the group having water-repellent property is dissociated and a residue (an amino group) having hydrophilic property is generated, the latent image including the hydrophilic region and the water-repellent region can be formed after the irradiation with light.

Specifically, as shown in FIG. 2(b), a photomask 13 having an exposed region having a predetermined pattern is prepared. An exposure method is not limited to a method using the photomask. As the exposure method, a method such as projection exposure using optical systems such as lenses and mirrors and maskless exposure using spatial light modulator, laser beam, or the like can be used. The photomask 13 may be provided so as to be in contact with the photoresponsive film 12 or may be provided so as not to be in contact with the photoresponsive film 12.

Thereafter, as shown in FIG. 2(c), the photoresponsive film 12 is irradiated with UV light through the photomask 13. Accordingly, the photoresponsive film 12 is exposed in the exposed region of the photomask 13 and a hydrophilic region 14 is formed.

The irradiation can be performed with the UV light having a wavelength at which the optimum quantum efficiency is exhibited by the structure of the photosensitive group. An i-ray at 365 nm is exemplary example. In addition, the exposure amount and the exposure time do not necessarily need to completely proceed with deprotection, and may satisfy an extent that deprotection partially occurs. In this case, in a plating step to be described later, conditions (such as activity of the plating bath) according to the degree of progress of deprotection can be appropriately changed.

In the present step, the light used for irradiation is preferably ultraviolet light. The light used for irradiation preferably includes light having a wavelength in a range of 200 to 450 nm, and more preferably includes light having a wavelength in the range of 320 to 450 nm. In addition, it is also preferable to perform irradiation with light including light having a wavelength of 365 nm. The light having these wavelengths can efficiently decompose the protective group of the compound used in the present embodiment. Examples of light source include a low-pressure mercury lamp, a high-pressure mercury lamp, an ultra-high-pressure mercury lamp, a xenon lamp, and a sodium lamp; and gas laser using nitrogen or the like, liquid laser using an organic dye solution, and solid laser containing rare-earth ions in an inorganic single crystal.

In addition, as the light source other than the laser with which monochromatic light is obtained, light having a specific wavelength obtained by extracting a broadband line spectrum or continuous spectrum using an optical filter such as a bandpass filter or a cutoff filter may be used. From a point that a large area can be irradiated at a time, a high-pressure mercury lamp or an ultra-high-pressure mercury lamp is preferable as the light source.

In the pattern forming step of the present embodiment, irradiation can be performed with predetermined light in the range above, and it is particularly preferable to perform the irradiation with light energy having a distribution corresponding to a circuit pattern.

The exposure step is not particularly limited. The exposure may be performed once or a plurality of times. In addition, in a case where a transparent object is processed, the exposure may be performed from the object side. From a viewpoint that the exposure step can be more shortened, the exposure is preferably performed once.

[Optional Post-Exposure Heating Step]

In the present embodiment, heating may be performed after the exposure step. Examples of a method for heating include an oven, a hot plate, and an infrared heater. A heating temperature may be 40° C. to 200° C., or may be 50° C. to 120° C.

[Optional Cleaning Step]

In the present embodiment, a cleaning step may be provided after the exposure step or the heating step. Examples of a cleaning method include immersion cleaning, spray cleaning, and ultrasonic cleaning. As a cleaning liquid, a polar solvent such as water or alcohol, a non-polar solvent such as toluene may be used, or a mixed solution thereof or a solution containing an additive such as a surfactant may be used. In addition, after cleaning, a drying step such as gas spraying or heating may be provided.

[Disposition Step]

The present step is a step of disposing the conductive material in the hydrophilic region formed in the exposure step. The gate electrode is prepared by this step.

First, as shown in FIG. 2(d), a catalyst for electroless plating is applied to the hydrophilic region 14 to form a catalyst layer 15.

The catalyst for electroless plating is a catalyst that reduces metal ions contained in a plating solution for electroless plating, and examples thereof include silver and palladium. In a case where substitution plating or autocatalytic plating is performed as electroless plating, metal fine particles such as copper, nickel, and gold can be used instead of the above catalyst. The amino group is exposed on the surface of the hydrophilic region 14, and the amino group can capture and reduce the above-described catalyst for electroless plating. Therefore, the catalyst for electroless plating is captured only on the hydrophilic region 14, and the catalyst layer 15 is formed. In addition, as the catalyst for electroless plating, a catalyst capable of supporting a hydrophilic group such as an amino group generated by decomposition of the protective group can be used.

In the next step, as shown in FIG. 2(e), the substrate 11 is immersed in an electroless plating bath to reduce metal ions on the catalyst surface, thereby depositing the plating layer 16. Examples of a material of the plating layer 16 include nickel-phosphorus (NiP) and copper (Cu). Since the catalyst layer 15 supporting a sufficient amount of the catalyst is formed on the surface of the hydrophilic region 14, the plating layer 16 can be selectively deposited only on the hydrophilic region 14. In a case where the reduction is insufficient, the substrate may be immersed in a reducing agent solution such as sodium hypophosphite or sodium borohydride to actively reduce the metal ions on the amine.

The conductive material can be arranged in the hydrophilic region by the steps above.

Further, in the present step, the conductive material can be disposed on the hydrophilic region by applying a pattern forming material including a dispersion liquid in which conductive fine particles are dispersed in a dispersion medium. As the conductive fine particles, for example, in addition to metal fine particles containing any one of gold, silver, copper, palladium, nickel, and ITO, oxides thereof, and fine particles of a conductive polymer or a superconductor are used.

These conductive fine particles can be used by coating the surface with an organic substance or the like in order to improve dispersibility.

The dispersion medium is not particularly limited as long as it can disperse the conductive fine particles described above and does not cause aggregation. For example, in addition to the water, alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, and p-dioxane; and polar compounds such as propylene carbonate, γ-butyrolactone, N-methyl-2-pyrrolidone, dimethylformamide, dimethylsulfoxide, and cyclohexanone can be exemplary examples. Among these, from points that dispersibility of fine particles, stability of dispersion liquid, and ease of application to a droplet discharge method (ink jet method), water, alcohols, hydrocarbon compounds, and ether-based compounds are preferable, and examples of a more preferable dispersion medium can include water and hydrocarbon compounds.

As the liquid semiconductor material, an organic semiconductor material dispersed or dissolved in a dispersion medium can be used. As the organic semiconductor material, a π-electron conjugated polymer material whose skeleton is formed of conjugated double bonds is desirable. Typically, examples thereof include a soluble polymer material such as polythiophene, poly(3-alkylthiophene), a polythiophene derivative, and pentacene.

As a method for disposing the pattern forming material, a droplet discharge method, an ink jet method, a spin coating method, a roll coating method, and a slot coating method can be applied.

Object

The object is not particularly limited. In the present embodiment, examples of a material of the object include metal, crystalline materials (for example, single crystalline, polycrystalline, and partially crystalline materials), amorphous materials, a conductor, a semiconductor, an insulator, a fiber, glass, ceramics, zeolite, plastic, and thermosetting and thermoplastic materials (for example, polyacrylates, polycarbonates, polyurethanes, polystyrenes, cellulosic polymers, polyolefins, polyamides, polyimides, polyesters, polyphenylenes, polyethylenes, polyethylene terephthalates, polypropylenes, ethylene vinyl copolymers, and polyvinyl chloride, which are optionally doped). In addition, the object may be an optical element, a coated substrate, a film, and the like, and these may have flexibility.

Here, the term "flexibility" means a property that even when applying a force of about own weight of a substrate to the substrate, the substrate can be bent without breaking or fracture. In addition, a property of bending by a force of about own weight is also included in the flexibility. In addition, the flexibility varies depending on a material, a size, a thickness, environment such as temperature, and the like of the substrate. As the substrate, a band-shaped single substrate may be used. The substrate can be configured such that a plurality of unit substrates are connected to form a band.

<<Insulating Film Forming Step>>

Figure 3:
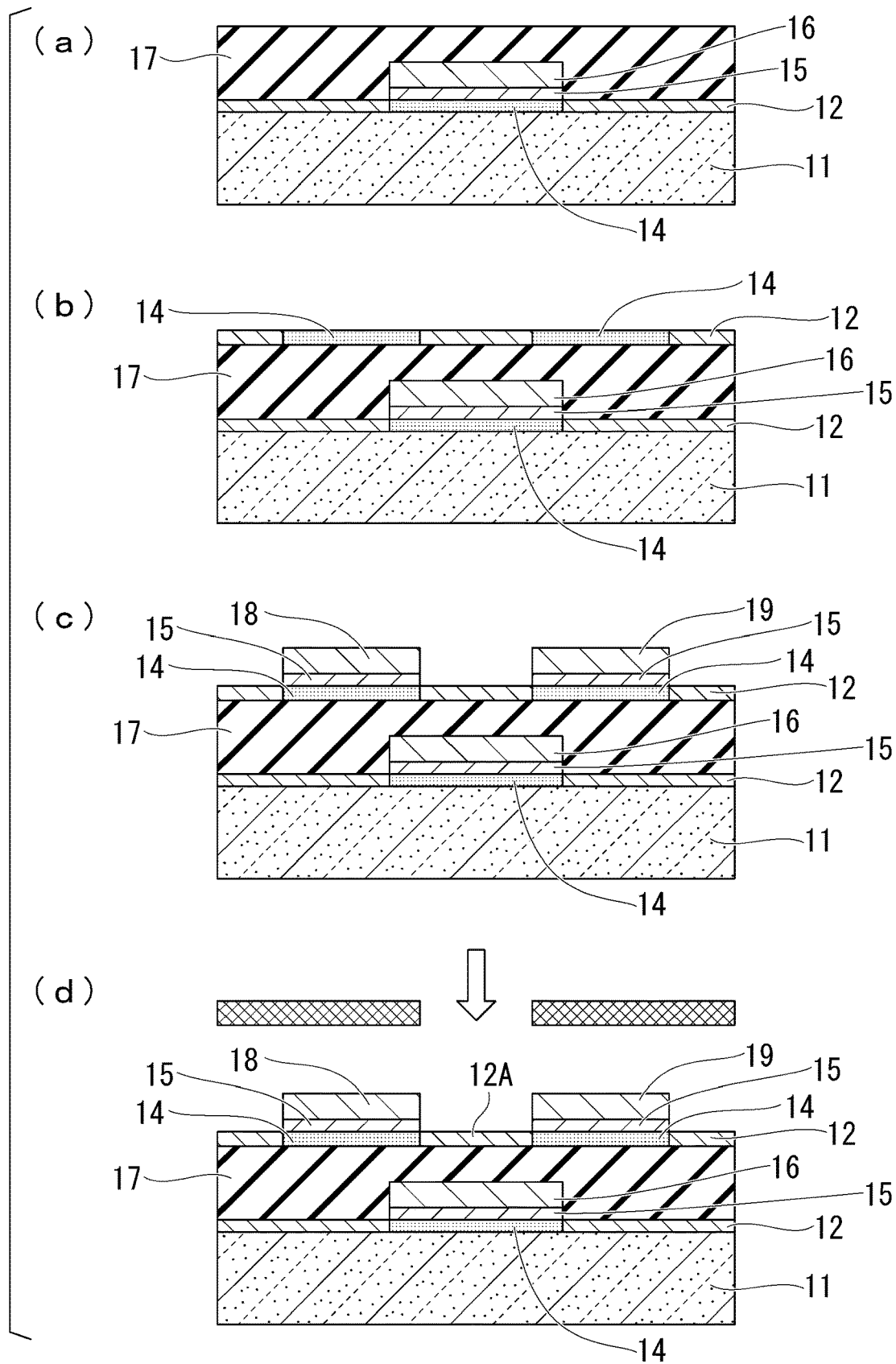
FIG. 3 is a diagram showing an example of a schematic step of the transistor production method.

As shown in FIG. 3(a), an insulating layer 17 is formed on the photoresponsive film 12 by covering the plating layer 16 with the electroless plating pattern formed by the above-described electroless plating pattern forming method by a known method. The insulating layer 17 may be formed in a manner that, for example, an application solution obtained by dissolving one or more resins of an ultraviolet-curable acrylic resin, an epoxy resin, an en-thiol resin, a silicone resin, and an imide resin in an organic solvent is used and the application solution is applied. When irradiating the coated film with ultraviolet light through a mask provided with an opening corresponding to a region where the insulating layer 17 is formed, the insulating layer 17 can be formed in a desired pattern.

The insulating film material is not limited to the organic material, and an inorganic material may be used. In addition, a metal oxide precursor such as organic silane may be used. An insulating film forming method is not limited to the above application method, and known film forming techniques such as a physical vapor deposition (PVD) method, a chemical vapor deposition (CVD) method may be used.

<<Second Pattern Forming Step>>

The second pattern forming step for preparing the source electrode and the drain electrode will be described.

As shown in FIG. 3(b), the hydrophilic region 14 is formed in a portion where a source electrode and a drain electrode are formed on the insulating layer 17, in the same manner as in the first pattern forming method described above.

As shown in FIG. 3(c), the catalyst for electroless plating is supported on the hydrophilic region 14 formed on the insulating layer 17 to form the catalyst layer 15 in the same manner as in the first pattern forming method described above. Thereafter, a plating layer 18 (source electrode) and a plating layer 19 (drain electrode) are formed by performing electroless plating. Examples of a material of the plating layers 18 and 19 also include nickel-phosphorus (NiP) and copper (Cu), and the plating layers 18 and 19 may be formed of a material different from that of the plating layer 16 (gate electrode). In addition, also in the second pattern forming step, the source electrode and the drain electrode may be formed by using the pattern forming material described in the first pattern forming step.

<<Modified Layer Forming Step>>

In the present embodiment, the unexposed area formed in the second pattern forming step is subjected to a plasma irradiation to remove a water-repellent film and further subjected to a surface treatment to form a modified layer.

A water-repellent region 12A in FIG. 3(d) is a layer containing a compound having a photoresponsive nitrobenzyl group. In the modified layer forming step, irradiation is performed with plasma to remove the water-repellent region 12A. The surface treatment is further performed. As a result, carrier traps can be suppressed, and adhesion, crystallinity or orientation with a material to be laminated on the upper layer can further be improved.

Plasma Irradiation Step

Figure 4:
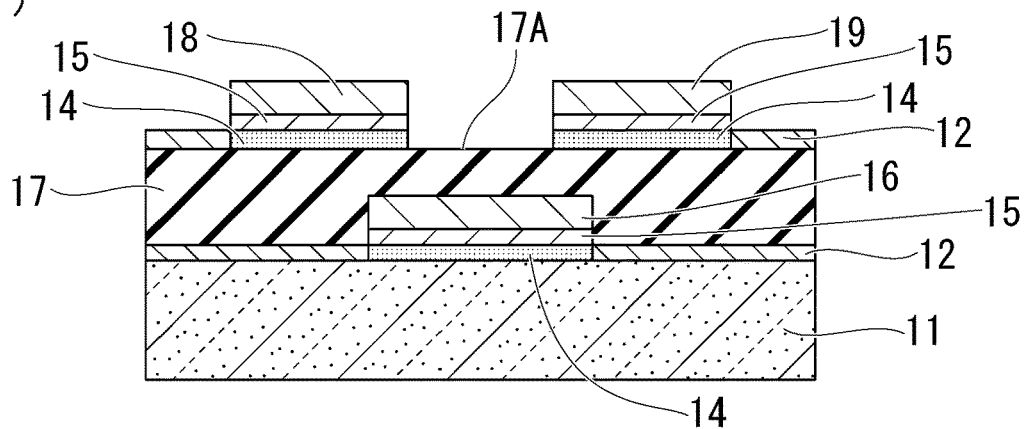
FIG. 4 is a diagram showing an example of a schematic step of the transistor production method.
Figure 4:
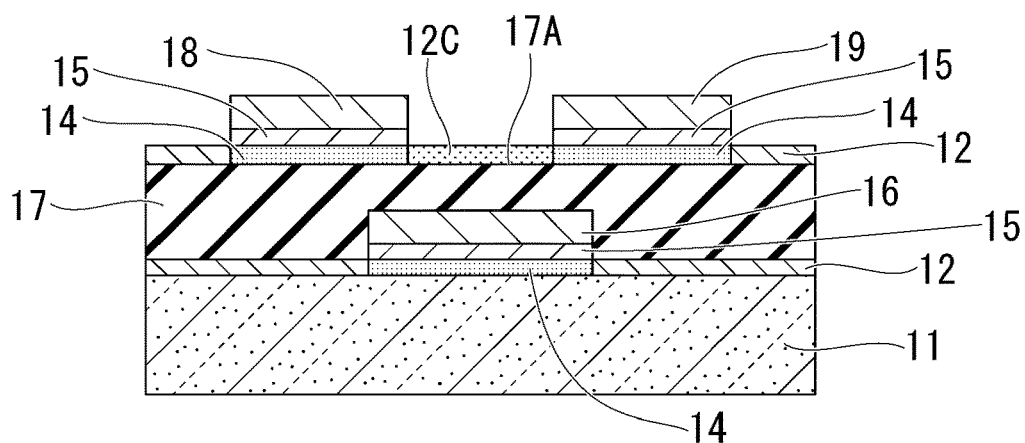
Figure 4:
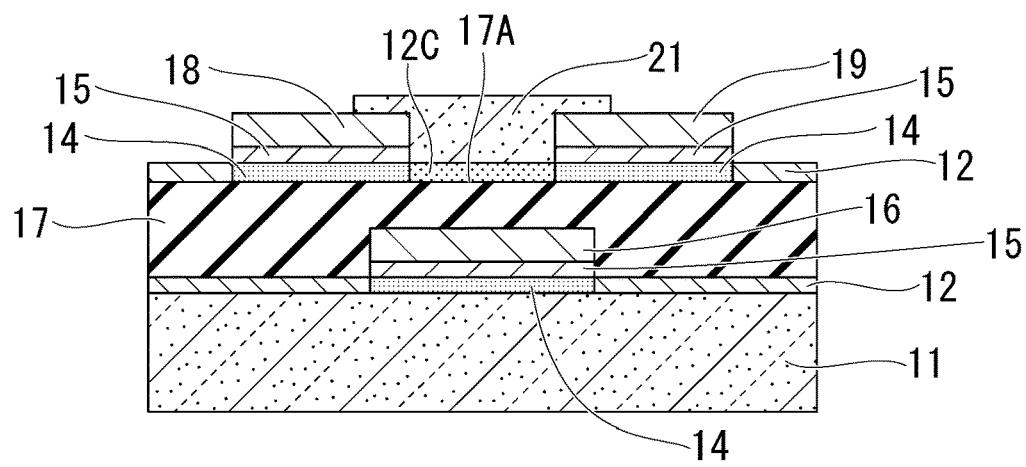

In the modified layer forming step, as shown in FIG. 3(d), the water-repellent region 12A is irradiated with plasma. The water-repellent region 12A is removed by subjecting the water-repellent region 12A to the plasma irradiation. As a result, an outermost surface 17A of an insulating layer 17 shown in FIG. 4(a) is exposed. The plasma irradiation step may be carried out by irradiation with a plasma-forming gas using a known plasma irradiation device.

Hydroxyl groups are generated on the outermost surface 17A of the insulating layer exposed by plasma irradiation.

In the plasma irradiation step, the water-repellent region 12A may not necessarily be completely removed in the plasma irradiation region, and at least a part of the water-repellent region 12A in the plasma irradiation region may be removed.

Surface Treatment Step

The present step is a step of protecting the hydroxyl groups exposed by the plasma irradiation step, using a surface treatment agent. As the surface treatment agent used in the present step, a surface treatment agent such as a silazane compound or a chlorosilane compound can be used. In addition, the surface treatment layer formed by the surface treatment step may be a layer formed of a self-assembled monolayer SAM film material.

When the self-assembled monolayer SAM film material is used, functional groups such as electron-rich phenyl groups or fluorine atoms can be disposed on the surface of the insulating film using a molecular orientation. As a result, an interface between the insulating film and the semiconductor layer becomes an electron-rich state. A hole-rich layer (positive charge) can be formed at a semiconductor-side interface by charge repulsion from the electron-rich insulating film interface.

It is also possible to obtain a surface containing two or more kinds of compounds by using two or more different surface treatment agents. In this case, for example, the plasma irradiation amount and the plasma irradiation time in irradiation of the plasma irradiation step described above are controlled, and a part of the water-repellent region in the plasma irradiation region is removed.

Moreover, after treating the exposed hydroxyl groups with a surface treatment agent, the plasma irradiation step at the second time is performed to remove the remaining water-repellent region that has not been removed. Next, the hydroxyl groups exposed in the plasma irradiation step at the second time are treated with different surface treatment agents to obtain a surface containing two or more kinds of compounds.

Specific examples of the compound contained in the surface treatment agent used in the present embodiment include a surface treatment agent containing silazane-based compounds shown in (3)-1 and (3)-2 and chlorosilane-based compounds shown in (4)-1 to (4)-3.

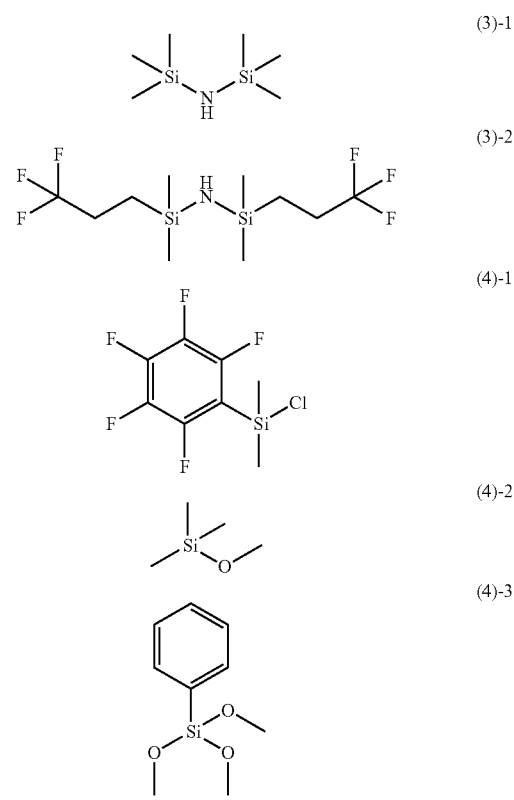

As a method for performing the surface treatment, a known method such as a dipping method and a chemical treatment method can be used. An activator, a condensing agent, or the like for promoting a reaction may be used. In addition, a cleaning treatment may be appropriately performed in order to avoid adhesion due to physical adsorption.

By performing the surface treatment with the surface treatment agent containing the compounds listed above, a surface treated area 12c is formed as shown in FIG. 4(b).

An effect of forming the surface treated area 12c will be described with reference to a p-type semiconductor as an example.

By forming the surface treated area 12c, it is possible to suppress or eliminate a defect in the insulating film and an influence of carrier traps due to hydrophilic groups. As a result, it is possible to improve a carrier mobility and subthreshold characteristics.

Also, at the interface between the insulating film and the semiconductor, an accumulation density of the positive charge generated on an organic semiconductor side is improved, and thus an on/off ratio can be improved. Depending on a dipole at this time, that is, a strength of a charge distribution in a molecule, a gate voltage required to perform turning on changes. That is, it is also possible to control a threshold voltage by selecting a surface modifier.

As the surface charge changes due to the surface treatment, a surface free energy also decreases. Accordingly, molecular reorientation and crystallization during film formation of a polymer and a low molecular weight organic semiconductor are promoted, and it is possible to improve transistor characteristics.

As shown in FIG. 4(c), a semiconductor layer 21 is formed between the plating layer 18 (source electrode) and the plating layer 19 (drain electrode). The semiconductor layer 21 may be formed in a manner that, for example, a solution in which an organic semiconductor material soluble in an organic solvent such as TIPS pentacene (6,13-Bis (triisopropyl silylethynyl) pentacene) is dissolved in the organic solvent is prepared, and the solution is applied between the plating layer 18 (source electrode) and the plating layer 19 (drain electrode) and dried. Before forming the semiconductor layer 21, the compound layer 12 between the plating layer 18 (source electrode) and the plating layer 19 (drain electrode) may be exposed to have hydrophilicity. By making the portion corresponding to a channel of the transistor hydrophilic, the solution is suitably applied to the hydrophilic portion, and the semiconductor layer 21 is easy to be selectively formed. In addition, the semiconductor layer 21 may be formed in a manner that one or more kinds of insulating polymer such as polystyrene (PS) or polymethyl methacrylate (PMMA) is added to the solution, and the solution containing the insulating polymer is applied and dried. When the semiconductor layer 21 is formed in this manner, the insulating polymer is concentrated and formed below the semiconductor layer 21 (on the insulating layer 17 side). In a case where a polar group such as an amino group is present at the interface between the organic semiconductor and the insulating layer, transistor characteristics tend to deteriorate. However, when adopting a configuration in which the organic semiconductor is provided through the insulating polymer, the deterioration in transistor characteristics can be suppressed. As described above, a transistor can be produced.

A structure of the transistor is not particularly limited and can be appropriately selected depending on the purpose. In aspects of FIGS. 2 to 4, a production method for a bottom-contact and bottom-gate type transistor has been described. However, top-contact and bottom-gate type, top-contact and top gate type, and bottom-contact and top-gate type transistors may also be produced in the same manner.

Hereinafter, an example of the pattern forming method of the present embodiment will be described with reference to the drawings.

In the pattern forming method of the present embodiment, in a case where a flexible substrate for a so-called roll-to-roll process is used, the pattern may be formed by using the substrate processing apparatus 100 which is a roll-to-roll apparatus as shown in FIG. 1.

As shown in FIG. 1, the substrate processing apparatus 100 includes a substrate feeding unit 2 that feeds a band-shaped substrate (for example, a band-shaped film member) S; substrate processing unit 3 that performs processing on a surface (a surface to be processed) Sa of the substrate S; a substrate recovery unit 4 that recovers the substrate S; an application unit 6 of the compound having a photoresponsive nitrobenzyl group; an exposure unit 7; a mask 8, a pattern material application unit 9; and a control unit CONT that controls these units. The substrate processing unit 3 can execute various processing on the surface of the substrate S after the substrate S is sent out from the substrate feeding unit 2 and before the substrate S is recovered by the substrate recovery unit 4.

The substrate processing apparatus 100 can be suitably used, for example, in a case where a display element (electronic device) such as an organic EL element or a liquid crystal display element is formed on the substrate S.

Although FIG. 1 shows a method using a photomask to generate a desired pattern light, the present embodiment can be suitably applied to a maskless exposure method without using the photomask. Examples of the maskless exposure method for generating the pattern light without using the photomask include a method using a spatial light modulator such as DMD and a method of scanning with a spot light like a laser beam printer.

In the pattern forming method of the present embodiment, an XYZ coordinate system is set as shown in FIG. 1, and the following description will be made using the XYZ coordinate system as appropriate. In the XYZ coordinate system, for example, an X axis and a Y axis are set along a horizontal plane, and a Z axis is set upward along a vertical direction. In addition, the substrate processing apparatus 100 transports the substrate S from a minus side (−side) to a plus side (+side) along the X axis as a whole. In this case, the width direction (short direction) of the band-shaped substrate S is set in the Y-axis direction.

As the substrate S which is to be processed in the substrate processing apparatus 100, for example, a foil of a resin film, stainless steel, or the like can be used. For example, for the resin film, a material such as polyethylene resin, polypropylene resin, polyester resin, ethylene vinyl copolymer resin, polyvinyl chloride resin, cellulose resin, polyamide resin, polyimide resin, polycarbonate resin, polystyrene resin, and vinyl acetate resin can be used.

It is preferable that the substrate S has a small coefficient of thermal expansion such that a dimension thereof does not change even when receiving heat of about 200° C., for example. For example, the dimensional change can be suppressed by annealing the film. In addition, it is possible to make the coefficient of thermal expansion small by mixing an inorganic filler with the resin film. Examples of the inorganic filler include titanium oxide, zinc oxide, alumina, and silicon oxide. In addition, the substrate S may be a single piece of ultra-thin glass having a thickness of about 100 μm produced by a float method or the like, or may be a laminate obtained by pasting the resin film or an aluminum foil to the ultra-thin glass.

The dimension in the width direction (short direction) of the substrate S is, for example, formed to be about 1 m to 2 m, and the dimension in the length direction (long direction) is, for example, formed to be 10 m or larger. Of course, this dimension is merely an example, and is not limited thereto. For example, the dimension of the substrate S in the Y direction may be 50 cm or smaller, or may be 2 m or larger. In addition, the dimension of the substrate S in the X direction may be 10 m or smaller.

The substrate S is preferably formed to have flexibility. Here, the term "flexibility" means a property that even when applying a force of about own weight of a substrate to the substrate, the substrate can be bent without breaking or fracture. In addition, a property of bending by a force of about own weight is also included in the flexibility.

In addition, the flexibility varies depending on a material, a size, a thickness, environment such as temperature, and the like of the substrate. As the substrate S, a band-shaped single substrate may be used. The substrate may be configured such that a plurality of unit substrates are connected to form a band.

The substrate feeding unit 2 sends out and feeds the substrate S, for example, wound in a roll shape to the substrate processing unit 3. In this case, the substrate feeding unit 2 is provided with a shaft part around which the substrate S is wound, a rotation driving device for rotating the shaft part, and the like. In addition, for example, a configuration in which a cover part or the like that covers the substrate S in a state of being wound in a roll shape is provided may be adopted. The substrate feeding unit 2 is not limited to a mechanism that sends out the substrate S wound in a roll shape, and may be any unit as long as the substrate feeding unit 2 includes a mechanism (for example, a nip-type driving roller) that sequentially sends out the band-shaped substrate S in a length direction thereof.

The substrate recovery unit 4 recovers the substrate S that has passed through the substrate processing apparatus 100, for example, by winding in a roll shape. Similar to the substrate feeding unit 2, the substrate recovery unit 4 is provided with a shaft part for winding the substrate S, a rotation driving source for rotating the shaft part, a cover part for covering the recovered substrate S, and the like. In a case where the substrate S is cut into a panel shape in the substrate processing unit 3, a configuration in which the substrate S is recovered in a state different from the state of being wound in a roll shape may be adopted. For example, the substrate S is recovered in a stacked state.

The substrate processing unit 3 transports the substrate S fed from the substrate feeding unit 2 to the substrate recovery unit 4, and performs a step of forming the photoresponsive film on a surface Sa to be processed of the substrate S during the transport, a step of performing irradiation with light with a predetermined pattern, and a step of disposing the pattern forming material. The substrate processing unit 3 includes an application unit 6 that applies a material for forming the photoresponsive film to the surface Sa to be processed of the substrate S, the exposure unit 7 that performs irradiating with light, a mask 8, a pattern material application unit 9, and a transporting device 20 including a driving roller R for feeding the substrate S under the condition corresponding to a processing mode.

Examples of the application unit 6 and the pattern material application unit 9 include a droplet application device (for example, a droplet discharge application device, an ink jet application device, a spin coating application device, a roll coating application device, and a slot coating application device).

Each device of these is appropriately provided along the transport path of the substrate S, and a panel or the like of a flexible display can be produced by a so-called roll-to-roll method. In the present embodiment, it is assumed that the exposure unit 7 is provided, and a device for performing steps before and after the step (such as photosensitive layer forming step and photosensitive layer developing step) is provided inline as necessary.

<<Compound>>

The compound having the photoresponsive nitrobenzyl group used in the present embodiment is preferably a fluorine-containing compound represented by General Formula (1) below.

(1)

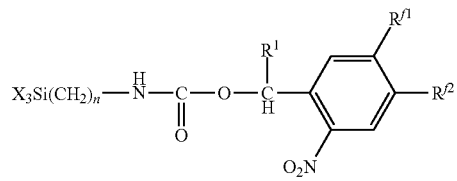

[In General Formula (1), X represents a halogen atom or an alkoxy group, $R^1$ represents a hydrogen atom or a linear, branched, or cyclic alkyl group having 1 to 10 carbon atoms, $R^{f1}$ and $R^{f2}$ are each independently an alkoxy group, a siloxy group, or a fluorinated alkoxy group, and n represents an integer of 0 or more.]

In General Formula (1) above, X is a halogen atom or an alkoxy group. Examples of the halogen atom represented by X include a fluorine atom, a chlorine atom, a bromine atom, and an iodine atom. X is more preferably an alkoxy group rather than the halogen atom. n represents an integer and is preferably an integer of 1 to 20 and more preferably an integer of 2 to 15 from a viewpoint of easy availability of a starting material.

In General Formula (1), $R^1$ is a hydrogen atom or a linear, branched, or cyclic alkyl group having 1 to 10 carbon atoms.

The alkyl group of $R^1$ is preferably a linear or branched alkyl group having 1 to 5 carbon atoms. Specific examples thereof include a methyl group, an ethyl group, a propyl group, an isopropyl group, an n-butyl group, an isobutyl group, a tert-butyl group, a pentyl group, an isopentyl group, and a neopentyl group.

Examples of the cyclic alkyl group include groups obtained by removing one or more hydrogen atoms from polycycloalkane such as monocycloalkane, bicycloalkane, tricycloalkane, and tetracycloalkane.

In the present embodiment, le is preferably a hydrogen atom, a methyl group, or an ethyl group.

In General Formula (1), $R^{f1}$ and $R^{f2}$ are each independently an alkoxy group, a siloxy group, or a fluorinated alkoxy group.

In General Formula (1), the alkoxy group, the siloxy group, or the fluorinated alkoxy group of $R^{f1}$ or $R^{f2}$ is preferably an alkoxy group having 3 or more carbon atoms, which may be partially fluorinated or may be a perfluoroalkoxy group. In the present embodiment, the fluorinated alkoxy group which is partially fluorinated is preferable.

In the present embodiment, examples of the fluorinated alkoxy group of $R^{f1}$ or $R^{f2}$ include a group represented by $-O-(CH_2)_{n^{f1}}-(C_{n^{f2}}F_{2n^{f2}+1})$. $n^{f1}$ is an integer of 0 or more, and $n^{f2}$ is an integer of 0 or more.

In the present embodiment, $n^{f1}$ is preferably 0 to 30, more preferably 0 to 15, and particularly preferably 0 to 5.

In addition, in the present embodiment, $n^{f2}$ is preferably 0 to 30, more preferably 0 to 15, and particularly preferably 1 to 8.

In General Formula (1), n is an integer of 0 or more. In the present embodiment, n is preferably 1 or more, and more preferably 3 or more.

Specific examples of the fluorine-containing compound represented by General Formula (1) are shown below.

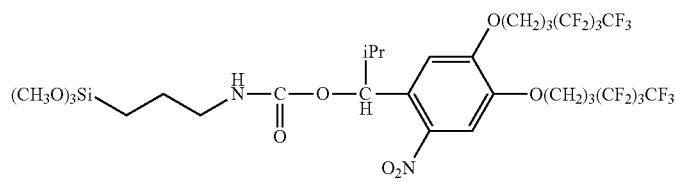

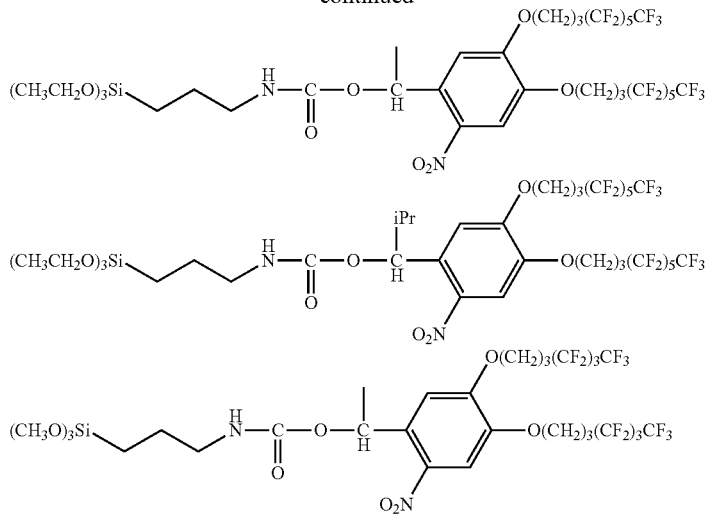

The fluorine-containing compound can be produced by a method disclosed in PCT International Publication No. WO 2015/029981.

An example of chemical modification in the present step is shown below. In the following formula, descriptions for X, $R^1$, $R'^1$, $R'^2$, and n are the same as those of $R^1$, $R'^1$, $R'^2$, and n in General Formula (1).

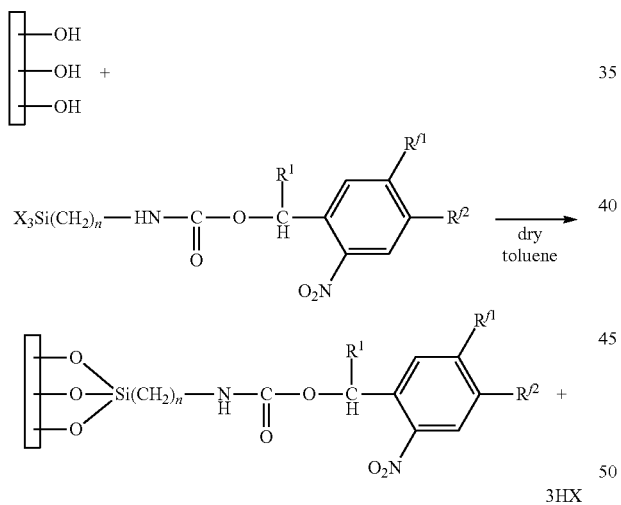

REFERENCE SIGNS LIST

S: Substrate
CONT: Control unit
Sa: Surface to be processed
2: Substrate feeding unit
3: Substrate processing unit
4: Substrate recovery unit
6: Fluorine-containing compound application unit
7: Exposure unit
8: Mask
9: Pattern material application unit
100: Substrate processing apparatus

What is claimed is:

1. A transistor production method comprising:
    forming a gate electrode on an object by using a conductive material;
    forming an insulating film on the gate electrode;
    forming a photoresponsive film on the insulating film by using a material containing a compound having a photoresponsive nitrobenzyl group;
    selectively exposing the photoresponsive film to dissociate the photoresponsive nitrobenzyl group in an exposed area;
    forming a pattern including a hydrophilic exposed area and a water-repellent unexposed area;
    disposing a conductive material in the exposed area to form a source electrode and a drain electrode;
    forming a modified layer by subjecting the unexposed area to a plasma irradiation to remove a water-repellent film and further subjecting to a surface treatment; and
    forming a semiconductor layer on the modified layer.

2. The transistor production method according to claim 1, wherein the surface treatment is performed using a silazane compound or a chlorosilane compound.

3. The transistor production method according to claim 1, wherein the pattern is a circuit pattern for an electronic device.

4. The transistor production method according to claim 1, wherein the compound is a compound that generates an amino group by decomposition of the photoresponsive nitrobenzyl group.

5. The transistor production method according to claim 1, wherein a material for forming the pattern includes a liquid conductive material or a liquid semiconductor material.

6. The transistor production method according to claim 1, wherein light for the exposure includes light having a wavelength in a range of 200 nm to 450 nm.

7. The transistor production method according to claim 1, wherein the object is a substrate formed of a resin material.

8. The transistor production method according to claim 1, wherein the object is a substrate having flexibility.

9. The transistor production method according to claim 1, wherein
    the pattern includes a hydrophilic region and a water-repellent region, and the transistor production method further comprises performing electroless plating by disposing a catalyst for electroless plating on the hydrophilic region or the water-repellent region.

10. The transistor production method according to claim 9, wherein in the electroless plating, the catalyst for electroless plating is disposed on the hydrophilic region.

11. An electronic device production method comprising: the transistor production method according to claim 1.

12. A transistor comprising:
a first layer containing a silazane compound or a chlorosilane compound, the first layer being located between a semiconductor layer and an insulating layer and being in contact with the semiconductor and the insulating layer;
a second layer containing an amino group, the second layer being located between a source electrode and the insulating layer; and
a third layer containing an amino group, the third layer being located between a drain electrode and the insulating layer,
wherein the first layer is located between the second layer and the third layer, and
wherein the transistor is a bottom-gate type transistor.

13. The transistor according to claim 12, wherein the source electrode and the drain electrode are formed of a material different from that of a gate electrode.

14. The transistor according to claim 12, wherein the source electrode and the drain electrode are formed of conductive fine particles.

15. The transistor according to claim 12, which is formed on a substrate having flexibility.

16. An electronic device, comprising:
the transistor according to claim 12.

* * * * *